(12) United States Patent
Sakamoto et al.

(10) Patent No.: US 6,833,198 B2
(45) Date of Patent: Dec. 21, 2004

(54) COPPER CLAD LAMINATE

(75) Inventors: Masaru Sakamoto, Ibaraki (JP); Kouji Kitano, Ibaraki (JP)

(73) Assignee: Nikko Materials Company, Limited, Tokyo (JP)

( * ) Notice: Subject to any disclaimer, the term of this patent is extended or adjusted under 35 U.S.C. 154(b) by 150 days.

(21) Appl. No.: 10/203,837

(22) PCT Filed: Mar. 30, 2001

(86) PCT No.: PCT/JP01/02707

§ 371 (c)(1),
(2), (4) Date: Aug. 14, 2002

(87) PCT Pub. No.: WO01/78473

PCT Pub. Date: Oct. 18, 2001

(65) Prior Publication Data

US 2003/0093899 A1 May 22, 2003

(30) Foreign Application Priority Data

Apr. 5, 2000 (JP) ........................................ 2000-103508

(51) Int. Cl.⁷ ........................... B32B 15/08; B32B 3/24; H05K 1/09; B23K 26/00; B23K 26/18
(52) U.S. Cl. ..................... 428/596; 428/607; 428/626; 428/612; 428/935; 428/687
(58) Field of Search ............................. 428/687, 612, 428/935, 626, 607, 606, 596

(56) References Cited

U.S. PATENT DOCUMENTS

| | | | |
|---|---|---|---|
| 5,545,466 A | 8/1996 | Saida et al. ................. 428/209 |
| 5,679,230 A * | 10/1997 | Fatcheric et al. ............. 205/50 |
| 5,858,517 A * | 1/1999 | Tagusari et al. ............ 428/209 |
| 5,989,727 A * | 11/1999 | Yates et al. ................. 428/607 |
| 6,107,003 A * | 8/2000 | Kuwako .................... 430/314 |
| 6,346,678 B1 | 2/2002 | Kono et al. ................. 174/255 |
| 6,372,113 B2 * | 4/2002 | Yates et al. ................. 205/111 |
| 6,475,638 B1 * | 11/2002 | Mitsuhashi et al. ......... 428/606 |
| 6,541,126 B1 * | 4/2003 | Yoshioka et al. ........... 428/624 |
| 6,638,642 B2 | 10/2003 | Kitano et al. ............... 428/607 |
| 2001/0042732 A1 * | 11/2001 | Yamamoto et al. ........... 216/13 |

FOREIGN PATENT DOCUMENTS

| | | |
|---|---|---|
| JP | 04-356993 | 12/1992 |
| JP | 06-270331 | 9/1994 |
| JP | 10-178253 | 6/1998 |
| JP | 11-087931 | 3/1999 |
| JP | 11-266068 | 9/1999 |
| JP | 2000-252609 | * 9/2000 |

OTHER PUBLICATIONS

Patent Abstracts of Japan, One page English Abstract of JP 06–270331.
Patent Abstracts of Japan, One page English Abstract of JP 11–266068.
Patent Abstracts of Japan, One page English Abstract of JP 04–356993.
Patent Abstracts of Japan, One page English Abstract of JP 10–178253.
Patent Abstracts of Japan, One page English Abstract of JP 11–087931.

* cited by examiner

*Primary Examiner*—John J. Zimmerman
(74) *Attorney, Agent, or Firm*—Howson and Howson

(57) ABSTRACT

There is provided a copper clad laminate which makes laser beam drilling extremely easy and is suitable for forming an interlayer connection microhole by improving a surface of its copper foil, which is to be used as the surface which a laser beam enters, in the production of printed circuit boards. Specifically, the copper clad laminate is such that it includes electrodeposited copper foil for use in the laser beam drilling and is characterized in that the matte side of the above electrodeposited copper foil is used as the surface which the laser beam enters.

4 Claims, No Drawings

COPPER CLAD LAMINATE

FIELD OF THE INVENTION

The present invention relates to a copper clad laminate excellent in hole processability in laser beam drilling which provides efficient formation of an via-hole in a printed circuit board.

BACKGROUND OF THE INVENTION

Recently, with the increasing wiring density, the laser beam drilling, which allows a finer processing than the conventional mechanical drilling, has been used more frequently in the production of electronic components and wiring boards both utilizing copper foil as a conductor.

However, when drilling a hole in a copper foil surface by illuminating the same with the carbon dioxide laser beam excellent in general-purpose properties, the reflectance of copper reaches almost 100% at the wavelengths of the carbon dioxide laser beam, that is, around 10 $\mu$m, leading to a problem of extremely low laser processing efficiency.

In order to offset such a decrease in processing efficiency, a high output carbon dioxide laser drilling machine is required; however, when performing laser processing with high energy of such a high output carbon dioxide laser drilling machine, the resin board subjected to drilling simultaneously with the copper foil is drilled to excess and damaged, which gives rise to a problem of being unable to drill a hole of intended shape.

Further, the amount of the splashed matter accompanying the laser processing becomes larger, which causes another problem of, for example, contamination of the laser drilling machine as well as the non-processed portion of the material having been subjected to the processing.

So, in order to avoid these problems, an attempt has been made to first make a hole in the copper foil portion by the chemical etching and then drill the resin portion by the laser beam. In this case, however, the number of the processes becomes larger than that of the case where the copper foil and the resin portion are drilled at a time, causing an increase in costs. Thus, this attempt also has a disadvantage.

On the other hand, as means for laser-processing a metal exhibiting a high reflectance at the laser beam wavelengths, a method has generally been adopted in which the surface of the metal is provided with a material with high absorptivity, so as to allow the material to absorb the laser beam and generate heat, and with the heat the metal is processed. Further, it has been known that roughing the material surface also allows a high processing efficiency.

Further, there has been proposed a method in which the surface of the copper foil is subjected to oxide treatment (black oxide treatment method) at the time of drilling, in order to increase the processing efficiency.

How ver, with any of the above proposals, the operations and treatments become complicated, and a sufficient laser processing efficiency cannot be obtained, considering how complicated they are. In addition, in the copper foil provided with the above-described surface treatment layer, the treatment layer tends to peel off since it is quite brittle and become a contamination source during the processing, which gives rise to another problem.

Further, there has been proposed a method in which copper foil itself is made thin so that it can be drilled by a low energy laser beam. However, since the thickness of the copper foil actually used varies from 9 $\mu$m to 36 $\mu$m, the copper foil can be made thin only for some cases. Furthermore, in order to perform drilling under such low energy conditions, the copper foil required to be as extremely thin as 3 to 5 $\mu$m, which causes another problem of handling etc.

As described so far, although there has been proposed several methods of improving the copper foil in current use, the present situation is that any of the methods is not satisfactory for the laser beam drilling, in other words, the copper foil materials suitable for the laser processing have not been obtained yet.

OBJECT OF THE INVENTION

The present invention has been made in light of the above-described problems. Accordingly, the object of the present invention is to provide a copper clad laminate which makes the laser beam drilling extremely easy and is suitable for forming an interlayer connection microhole by improving the surface of its copper foil, which is to be used as the surface which the laser beam enters, in the production of printed circuit boards.

SUMMARY OF THE INVENTION

The present invention provides:

1. a copper clad laminate including an electrodeposited copper foil for use in laser beam drilling, characterized in that a matte side of the above electrodeposited copper foil which has become the electrolyte side at the time of electrodeposition is used as a surface which a laser beam enters;

2. the copper clad laminate according to the above description 1, characterized in that a surface roughness Rz of the matte side of the above electrodeposited copper foil is 2.0 $\mu$m or more;

3. the copper clad laminate according to the above description 1 or 2, characterized in that the matte side of the above electrodeposited copper foil is subjected to additional roughening treatment by the electrodeposition;

4. the copper clad laminate according to any one of the above descriptions 1, 2 and 3, characterized in that a shinny side of the above electrodeposited copper foil is subjected to roughening treatment by electrodeposition; and 5. the copper clad laminate according to the above description 3, characterized in that roughening treatment is performed using any one or more of Ni, Co, Sn, Zn, In and alloys thereof as metals for use in the electrodeposition.

DETAILED DESCRIPTION OF THE PREFERRED EMBODIMENTS

Generally electrodeposited copper foil is produced by electrodeposition of copper on a drum, and one side of the electrodeposited copper foil in contact with the drum becomes a shinny side which is relatively flat and the other side exposed to an electrolysis solution becomes a matte side. When using this electrodeposited copper foil in a copper clad laminate, its matte side becomes a surface adhering to a resin of the laminate, on the other hand, its shinny side becomes a surface which a laser beam of, for example, carbon dioxide enters.

As described above, the copper foil itself has low absorptivity to the laser beam; accordingly, it is only natural that its shinny side is more difficult to make a hole by laser beam drilling. However, it has been found that if the shinny side is plated with particulate matter to 0.01 to 3 $\mu$m thick so as to form roughness thereon, its hole processability can be improved.

This fine roughness reflects the laser beam diffusely and can produce the same effect as that of the laser beam absorption, therefore, it is a very effective means for ensuring satisfactory hole processability even when drilling is performed by low energy laser beam such as carbon dioxide laser beam.

However, in order to ensure satisfactory hole processability by providing a flat shinny side of the electrodeposited copper foil with the above-described roughness through electrodeposition, the electrodeposition conditions of the treatment solution composition etc. are required to be strictly controlled. For example, when performing electrodeposition under such conditions that the roughness of the treated layer is made large in order to enhance the hole processability in the laser beam drilling, there arises a problem such that peel-off and dislodgement of the treated layer are likely to occur.

This peel-off and dislodgement of the treated layer can be gotten rid of to a considerable extent by allowing the electrodeposition composition to contain a copper component. On the other hand, in some cases, the electrodeposition composition is allowed to contain a large quantity of metal components other than copper so as to enhance the hole processability of the copper foil; however, in this case, the peel-off strength and dislodgement strength of the surface layer are decreased, leading to a big problem.

Thus, when using the shinny side of the electrodeposited copper foil as the surface which the laser beam enters, how the hole processability in the laser beam drilling and the adhesion strength of the surface layer should be made compatible with each other remains an open question. This is true of rolled copper foil.

When using electrodeposited copper foil in a copper clad laminate, according to the prior art, the matte side of the electrodeposited copper foil is used as the surface for bonding the electrodeposited copper foil and the resin of the laminate to each other and the shinny side of the same as the surface which the laser beam such, as carbon dioxide laser beam, enters; however, in the present invention, viewing this matter from a quite opposite angle, the matte side of the electrodeposited copper foil is used as the surface which the laser beam enters and the shinny side of the same as the surface for bonding the electrodeposited copper foil and the resin of the laminate to each other.

Thus, the bonding function of the matte side of the electrodeposited copper foil attendant on its adhesion strength is lost; however, the resin for use in copper clad laminates has been much improved in adhesion properties and strength and lately many copper clad laminates have not been required to have so high adhesion strength as before.

According to need, particulate projections (knotty projections) can be formed on the shinny side of the electrodeposited copper foil, through which the electrodeposited copper foil and the resin are bonded together, by electrodeposition to form roughness thereon, thereby the adhesion properties can be improved. Accordingly, in improving the adhesion properties of the shinny side to the resin, electrodeposition does not need such strict control as the case where the shinny side is used as the surface which the laser beam enters does; therefore, the use of the shiny side as the surface for bonding is not a big problem.

In this case, the electrodeposit does not appear on the surface layer of the copper clad laminate since it adhered to the resin of the same; therefore, the problem such that the rough portion on the surface layer of the copper clad laminate peels off and dislodges will not occur directly during the laser beam illumination.

The matte side of the electrodeposited copper foil for use in a copper clad laminate produces a satisfactory effect in improving the hole processability of the copper clad laminate in the carbon dioxide laser beam drilling, if its surface roughness Rz is 2.0 μm or more. The matte side formed during the formation of electrodeposited copper foil is originally part of the copper foil, accordingly, there occurs neither peel-off nor dislodgement therein.

The roughness of the matte side varies depending on the composition of the electrolysis solution and the current conditions, and there exists electrodeposited copper foil of which matte side has such a small surface roughness as is close to that of the shinny side. Even in that case, as long as the surface roughness Rz is 2.0 μm or more, the copper clad laminate is provided with satisfactory hole processability.

Further, when intending to improve the hole processability in the laser beam drilling, metal electrodeposit (an electroplated layer) can be newly formed on the matte side. This additional roughening treatment produces a satisfactory effect even if the quantity of the electrodeposit is far smaller than that of the case where roughness is formed on the shinny side.

There already exists roughness on the matte side of electrodeposited copper foil which has been formed by the electrodeposition during the formation of the electrodeposited copper foil, therefore, the additional formation of particles thereon can be performed at a lower current and a lower deposition rate than the formation of the same on a flat surface. Accordingly, it becomes easier to set the electrodeposition conditions under which neither peel-off nor dislodgement occurs.

This additional roughening treatment can improve the hole processability of the matte side of the electrodeposited copper foil not only when electrodepositing Cu to form particulate projections (knotty projections), but also when electrodepositing Ni, Co, Sn, Zn, In and the alloys thereof, all which have high laser beam absorptivity.

The electrodeposition of the above high absorptive materials may be performed after forming the above-described particulate projections (roughness) by Cu electrodeposition.

Desirably the thickness of the electrodeposited copper foil for use in the present invention is 18 μm or less, in view of its application as high density wiring. However, for the copper foil of the present invention having improved hole processability, its thickness is not limited to the above values, but the present invention applies to the copper foil with thickness more than 18 μm.

In the following, one example of the conditions will be shown under which roughening plating is performed using copper. The conditions themselves are well-known ones.

(Water-soluble Copper Sulfate Plating Bath)
$CuSO_4 \cdot 5H_2O$: 23 g/l (as Cu)
NaCl: 32 ppm (as Cl)
$H_2SO_4$: 70 g/l
Glue: 0.75 g/l
Deionized water: Bal.
(Plating Conditions)
Current density: 60 to 100 a.s.f
Duration: 10 to 60 sec.
Bath temperature: 70 to 80° F.

After completing the above electrodeposition, anti-corrosive treatment can be applied with a treatment solution containing chromium and/or zinc. The method of the anti-corrosive treatment or the treatment solution used therein is not limited to any specific one. This anti-corrosive treatment can be applied partially to the above electrodeposited surface, that is, the portion of the copper foil surface receiving the incident laser beam or to the entire copper foil surface.

Like the roughening treatment described above, it goes without saying that the anti-corrosive treatment should not destroy the properties which the copper foil applied to printed circuit boards should have, and the anti-corrosive treatment of the present invention fully satisfy this requirement. This anti-corrosive treatment hardly affects the hole proccesability of the copper foil in the laser beam drilling.

As a typical example of the plated layers consisting of Ni, Co, Sn, Zn, In and the alloys thereof which are used in the electrodeposition to enhance the laser beam absorptivity of the matte side of the copper foil, there is a copper-cobalt-nickel plating layer, and the conditions of the copper-cobalt-nickel plating treatment are shown below.

This example is shown as a preferred example for illustrative purpose only and is not intended to limit the present invention.

(Cu-Cobalt-Nickel Plating Treatment)
Co concentration: 1 to 15 g/L, Ni concentration: 1 to 15 g/L
Cu concentration: 5 to 25 g/L
Electrolysis solution temperature: 20 to 50° C., pH: 1.0 to 4.0
Current density: 1.5 to 30 A/dm$^2$, Plating duration: 1 to 180 seconds As the anti-corrosive treatment of the present invention, the plating treatment shown below, which is a typical example, is applicable. This example is shown as a preferred example for illustrative purpose only and is not intended to limit the present invention.

(Chromium Anti-corrosive Treatment)
$K_2Cr_2O_7$ ($Na_2Cr_2O_7$ or $CrO_3$): 2 to 10 g/L
NaOH or KOH: 10 to 50 g/L
ZnO or $ZnSO_4.7H_2O$: 0.05 to 10 g/L
PH: 3.0 to 4.0, Electrolysis solution temperature: 20 to 80° C.
Current density: 0.05 to 5 A/dm$^2$ Plating duration: 5 to 30 sec.

EXAMPLES

In the following, the present invention will be described based on the examples. It is to be understood that these examples are shown as preferred examples of the present invention and not intended to limit the same, and that various changes and modifications may be made therein without departing from the spirit and the scope of the invention.

For comparison, comparative examples will be added in the latter part.

Example 1

A copper clad laminate including electrodeposited copper foil 12 μm thick in which the matte side of the electrodeposited copper foil was used as the surface subjected to laser beam illumination (the shinny side of the same being bonded to the resin of the laminate). The surface roughness Rz of the matte side was 2.2 μm.

Example 2

A copper clad laminate including electrodeposited copper foil 12 μm thick in which the matte side of the electrodeposited copper foil was used as the surface subjected to laser beam illumination (the shinny side of the same being bonded to the resin of the laminate). The surface roughness Rz of the matte side was 3.0 μm.

Example 3

A copper clad laminate including electrodeposited copper foil 12 μm thick in which the matte side (with surface roughness Rz 3.0 μm) of the electrodeposited copper foil was subjected to roughening copper plating under the above-described conditions to deposit copper particles thereon, and the roughened surface was used as the surface subjected to laser beam illumination. The surface roughness Rz of the roughened surface was 3.5 μm.

Example 4

A copper clad laminate including electrodeposited copper foil 12 μm thick in which the matte side (with surface roughness Rz 3.0 μm) of the electrodeposited copper foil was subjected to roughening copper plating under the above-described conditions to deposit copper particles thereon, the roughened surface was further subjected to copper-cobalt-nickel alloy plating under the above-described conditions, and the plated surface was subjected to laser beam illumination. The surface roughness Rz of the roughened surface was 3.7 μm.

Comparative Example 1

A copper clad laminate including electrodeposited copper foil 12 μm thick in which the shinny side of the electrodeposited copper foil was used as the surface subjected to laser beam illumination. The surface roughness Rz of the shinny surface was 1.4 μm.

Comparative Example 2

A copper clad laminate including electrodeposited copper foil 12 μm thick in which the shinny side (with surface roughness Rz 1.4 μm) of the electrodeposited copper foil was subjected to copper-cobalt-nickel alloy plating and the plated surface was used as the surface subjected to laser beam illumination. The surface roughness Rz of the plated surface was 1.7 μm.

The composition of the copper-cobalt-nickel alloy was the same as the above-described example 3, and the plating was applied such an extent that the laser beam opening ratio became almost the same as that of example 3.

The samples of above examples 1 to 4 and comparative examples 1,2 were formed into single sided boards using a prepreg (FR-4), and 100 spots per board were illuminated with the laser beam under the following conditions and their opening ratio were compared. The results are shown in Table 1.

(Laser Illumination Conditions)
Machine used: Carbon dioxide laser beam machine
Spot size: 144 μmφ
Pulse width: 32 μsec
Frequency: 400 Hz, Shot number: 1 shot
Laser beam illumination energy: 13 mJ/shot, 21 mJ/shot, 32 mJ/shot, 42 mJ/shot.

TABLE 1

| | Roughness of Illuminated Surface Rz/μm | Laser Beam Opening ratio 13 mJ/shot | Laser Beam Opening ratio 21 mJ/shot | Laser Beam Opening ratio 32 mJ/shot | Laser Beam Opening ratio 42 mJ/shot | Powder Drop-off Test |
|---|---|---|---|---|---|---|
| Example 1 | 2.2 | 0% | 0% | 21% | 100% | ○ |
| Example 2 | 3.0 | 0% | 2% | 100% | 100% | ○ |
| Example 3 | 3.5 | 4% | 100% | 100% | 100% | ○ |
| Example 4 | 3.7 | 100% | 100% | 100% | 100% | ○ |
| Comparative Example 1 | 1.4 | 0% | 0% | 0% | 98% | ○ |
| Comparative Example 2 | 1.7 | 100% | 100% | 100% | 100% | x |

○ No Powder Drop-off
x A large amount of Powder Drop-off

In example 1, the surface which the laser beam entered was the matte side (Rz 2.2 μm) of the copper foil as it was. The opening ratio was 21% at a laser beam energy of 32 mJ/shot and reached 100% at 42 mJ/shot. No powder drop-off (peel-off and dislodgement of the surface layer) was observed.

In example 2, the surface which the laser beam entered was the matte side with surface roughness Rz 3.0 μm. The opening ratio was 2% at a laser beam energy of 21 mJ/shot and reached 100% at 32 mJ/shot. No powder drop-off (peel-off and dislodgement of the surface layer) was observed.

In example 3, the surface which the laser beam entered was the matte side having been subjected to roughing copper plating to deposit additional copper particles thereon and having surface roughness Rz 3.5 μm. The opening ratio was 4% at a laser beam energy of 13 mJ/shot and reached 100% at 21 mJ/shot. It is evident that the opening ratio was improved. No powder drop-off (peel-off and dislodgement of the surface layer) was observed, like the example 1.

In example 4, the surface which the laser beam entered was the matte side having been subjected to roughing copper plating to deposit additional copper particles and further subjected to copper-cobalt-nickel alloy plating. The opening ratio reached 100% at 13 mJ/shot. It is evident that the opening ratio was much more improved than example 3 and a hole can be made in the surface even with the low energy laser beam. No powder drop-off (peel-off and dislodgement of the surface layer) was observed.

In comparative example 1, the shinny side of the copper foil was used as the surface which the laser beam entered. It goes without saying that no powder-off was observed. The opening ratio was 98% even at a laser beam energy of 42 mJ/shot and, even if the output of the laser beam was increased, satisfactory opening ratio was not obtained.

In comparative example 2, the surface which the laser beam entered was the shinny side of the copper foil having been subjected to copper-cobalt-nickel alloy plating to form a particle layer thereon. Since the plating was applied to such an extent that its opening ratio reached the level of example 4, peel-off and dislodgement of the plated layer were extreme and powder drop-off occurred due to even a slight rub, which was a cause of contamination.

In addition, there arose a problem of a decrease in opening ratio at the portion where the peel-off and dislodgement occurred.

Although the above-described-examples do not cover a wide range of plating types, in any type of the plating shown above, the similar effects were obtained.

As is evident from the above, excellent laser beam opening ratios can be obtained using the matte side of electrodeposited copper foil of which surface roughness Rz is 2.0 μm or more as the surface subjected to laser beam illumination. In addition, the laser beam opening ratio can be further enhanced by subjecting the above matte side of electrodeposited copper foil to roughening treatment by the electrodepodition.

In the production of printed circuit boards, the present invention allows making a hole directly in copper foil and forming an via-hole in a simple and convenience manner by the low energy laser beam drilling using, for example, carbon dioxide laser beam, in addition, it is remarkably effective in preventing the peel-off and dislodgement of the plated layer caused by a rub.

What is claimed is:

1. A copper clad laminate, comprising:

an electrodeposited copper foil having a matte side, which is an electrolyte side of the copper foil during electrodeposition of the foil, and a shiny side opposite said matte side;

a resin layer bonded to said shiny side; and a metal electroplated surface layer formed on said matte side;

said metal electroplated surface layer containing at least one of Ni, Co, Sn, Zn, In and alloys thereof; and said copper foil and electroplated surface layer having laser beam-drilled via holes extending therethrough, said metal electroplated surface layer on said matte side of said copper foil being a surface into which a laser beam is directed and enters to form said laser beam-drilled via holes through said copper foil.

2. The copper clad laminate according to claim 1, wherein surface roughness Rz of the matte side of said electrodeposited copper foil is 2.0 μm or more.

3. A copper clad laminate according to claim 2, wherein said matte side of said electrodeposited copper foil is roughened by a roughening treatment by electrodeposition.

4. A copper clad laminate according to claim 3, wherein said shiny side is roughened by a roughening treatment by electrodeposition.

* * * * *